United States Patent
Park

(10) Patent No.: US 9,455,648 B2
(45) Date of Patent: Sep. 27, 2016

(54) VIBRATION GENERATING APPARATUS

(71) Applicant: SAMSUNG ELECTRO-MECHANICS CO., LTD., Suwon (KR)

(72) Inventor: Dong Sun Park, Suwon (KR)

(73) Assignee: MPLUS CO., LTD., Suwon-Si, Gyeonggi-Do (KR)

( * ) Notice: Subject to any disclaimer, the term of this patent is extended or adjusted under 35 U.S.C. 154(b) by 302 days.

(21) Appl. No.: 13/959,659

(22) Filed: Aug. 5, 2013

(65) Prior Publication Data

US 2014/0346927 A1 Nov. 27, 2014

(30) Foreign Application Priority Data

May 27, 2013 (KR) ........................ 10-2013-0059667

(51) Int. Cl.
*H02N 2/00* (2006.01)
*H01L 41/09* (2006.01)

(52) U.S. Cl.
CPC .......... *H02N 2/006* (2013.01); *H01L 41/0933* (2013.01)

(58) Field of Classification Search
CPC . H01L 41/0933; H01L 41/053; H01L 41/09; H01L 41/0533; B06B 1/0603; B06B 1/0644; B06B 1/0648; H02N 2/006; G08B 6/00
USPC ........................................ 310/328, 326, 312
IPC ......... H01L 41/09, 41/053, 41/047; H03H 9/09
See application file for complete search history.

(56) References Cited

U.S. PATENT DOCUMENTS

| | | | | |
|---|---|---|---|---|
| 8,324,786 B2* | 12/2012 | Kim | ........................ | G06F 3/016 310/328 |
| 8,928,204 B2* | 1/2015 | Yun | ........................ | H03H 9/09 310/323.01 |
| 9,118,299 B2* | 8/2015 | Kim | ........................ | H03H 9/09 |
| 2006/0119586 A1 | 6/2006 | Grant | | |

FOREIGN PATENT DOCUMENTS

| | | |
|---|---|---|
| CN | 1274197 A | 11/2000 |
| CN | 101489169 A | 7/2009 |
| CN | 201623850 U | 11/2010 |
| CN | 102025256 A | 4/2011 |
| CN | 102570898 A | 7/2012 |
| CN | 104396278 A | 3/2015 |

(Continued)

OTHER PUBLICATIONS

Office Action dated Aug. 21, 2014 for Korean Patent Application No. 10-2013-0059667 and its English summary provided by Applicant's foreign counsel.

(Continued)

*Primary Examiner* — Thomas Dougherty
*Assistant Examiner* — Karen B Addison
(74) *Attorney, Agent, or Firm* — LRK Patent Law Firm

(57) ABSTRACT

There is provided a vibration generating apparatus including: a housing having an internal space; a vibrator disposed and vibrating within the housing; and a plurality of damper members installed in at least one of the housing and the vibrator and formed of different materials, wherein the plurality of damper members are overlapped and formed integrally with each other or are disposed to be adjacent to each other.

10 Claims, 7 Drawing Sheets

(56) References Cited

FOREIGN PATENT DOCUMENTS

| JP | 2000069736 A | 3/2000 | | |
|---|---|---|---|---|
| JP | 2001-313995 | 11/2001 | | |
| KR | 10-2010-0111368 | 10/2010 | | |
| KR | 1020100111368 | * 10/2010 | ............. | H02K 35/02 |
| KR | 10-2011-0047520 | 5/2011 | | |
| KR | 1020110047520 | * 5/2011 | ............. | H02K 33/02 |
| KR | 10-1157868 B1 | 6/2012 | | |
| KR | 10-1250291 | 4/2013 | | |

OTHER PUBLICATIONS

SIPO Office Action for Chinese Patent Application No. 201310375740.9.

* cited by examiner

VIBRATION GENERATING APPARATUS

CROSS-REFERENCE TO RELATED APPLICATIONS

This application claims the priority of Korean Patent Application No. 10-2013-0059667 filed on May 27, 2013, in the Korean Intellectual Property Office, the disclosure of which is incorporated herein by reference in its entirety.

BACKGROUND OF THE INVENTION

1. Field of the Invention

The present invention relates to a vibration generating apparatus.

2. Description of the Related Art

A vibration generating apparatus, a component converting electrical energy into mechanical vibrations through the generation of electromagnetic force, is commonly mounted in a mobile phone to be used to silently notify a user of call reception by transferring vibrations thereto.

Meanwhile, in accordance with rapid growth in the mobile phone market and the trend for adding functionality to mobile phones, mobile phone components having a compact size and a high degree of quality have been required. In this situation, the demand for the development of a vibration generating apparatus having a novel structure capable of overcoming the disadvantages of existing vibration generating apparatuses, and having significantly improved quality with respect thereto, has increased.

In addition, as the release of smartphones has rapidly increased, a touchscreen scheme has been adopted therein, such that in addition to silently notifying a user of call reception, vibration generating apparatuses have been used in order to generate vibrations when the touchscreen is touched.

Degrees of performance required of the vibrations generated when the touchscreen is touched in particular, are as follows. First, since vibrations are generated more frequently in devices having touchscreens than in phones merely vibrating at the time of call reception, an operational lifespan of a vibration generating apparatus should be increased. Second, in order to improve user satisfaction when a user is provided with vibrations when the touchscreen is touched, a vibration response speed should be increased, in accordance with a speed at which the screen is touched.

In this regard, a piezo haptic actuator has been used as a product able to provide such levels of performance. The piezo haptic actuator uses an inverse piezoelectric effect in which displacement is generated when a voltage is applied to a piezo-element, that is, a principle of allowing a mass body provided on a movable element to be moved by the generated displacement to generate vibration force.

A vibrator having the above-mentioned structure has the following features. A bandwidth of a frequency able to provide a predetermined level of vibration force or greater is wide, such that stable vibration characteristics may be implemented with the use thereof, and vibrations having low and high frequencies within a predetermined frequency range, rather than a single frequency, may be variously used. In addition, since the vibrator may implement rapid operational response characteristics, it may be appropriate for implementing haptic feedback vibrations in a mobile device such as a mobile phone, or the like.

Meanwhile, the piezo-element generally is formed to have a rectangular parallelepiped shape. In this case, since the length of the piezo-element should be relatively long, in order to secure displacement and vibrations, the entire length of the vibration generating apparatus increases and the piezo-element is vulnerable to external impacts, such as those caused by a product being dropped.

Further, since the overall shape of the vibration generating apparatus is a rectangular parallelepiped, the overall volume thereof may be increased, such that miniaturization of components may not be feasible.

In addition, the vibrator and a vibrating apparatus housing may come into contact with each other while being driven, or in the case of an external impact, to thereby cause noise.

RELATED ART DOCUMENT (Patent Document 1) Korean Patent No. 1157868

SUMMARY OF THE INVENTION

An aspect of the present invention provides a vibration generating apparatus capable of increasing an amount of vibrations and decreasing noise generation and damage.

According to an aspect of the present invention, there is provided a vibration generating apparatus including: a housing having an internal space; a vibrator disposed and vibrating within the housing; and a plurality of damper members installed in at least one of the housing and the vibrator and formed of different materials, wherein the plurality of damper members are overlapped and formed integrally with each other or are disposed to be adjacent to each other.

The plurality of damper members may include a first damper member formed of a material having a high degree of hardness and a second damper member formed of a material having a degree of hardness lower than that of the first damper member.

The second damper member may contact the vibrator while the vibrator operates normally, and the first damper member may absorb an impact in the case the vibrator operates abnormally.

The second damper member may be disposed to face the vibrator, and the first damper member may be disposed to face the vibrator, having the second damper member disposed therebetween.

The second damper member may have a thickness less than that of the first damper member to contact the vibrator at the time of the abnormal operation of the vibrator.

According to another aspect of the present invention, there is provided a vibration generating apparatus including: a housing having an internal space; an elastic member having both end portions thereof fixedly attached to the housing; a piezoelectric element installed on the elastic member and deformed in the case in which power is applied thereto; a mass body connected to the elastic member to amplify vibrations generated by the deformation of the piezoelectric element; and a plurality of damper members installed in at least one of the housing, the elastic member, the piezoelectric element, and the mass body and formed of different materials, wherein the plurality of damper members are overlapped and formed integrally with each other or are disposed to be adjacent to each other.

The plurality of damper members may include a first damper member formed of a material having a high degree of hardness and a second damper member formed of a material having a degree of hardness lower than that of the first damper member.

The second damper member may contact the mass body and the piezoelectric element in the case that the elastic member operates normally, and the first damper member may absorb an impact applied to the housing and the piezoelectric element in the case that the elastic member operates abnormally.

The second damper member may be disposed to face the mass body and the piezoelectric element, and the first damper member may be disposed to face the mass body and the piezoelectric element, having the second damper member disposed therebetween.

The second damper member may have a thickness less than that of the first damper member to contact the mass body and the piezoelectric element in the case that the elastic member operates abnormally.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
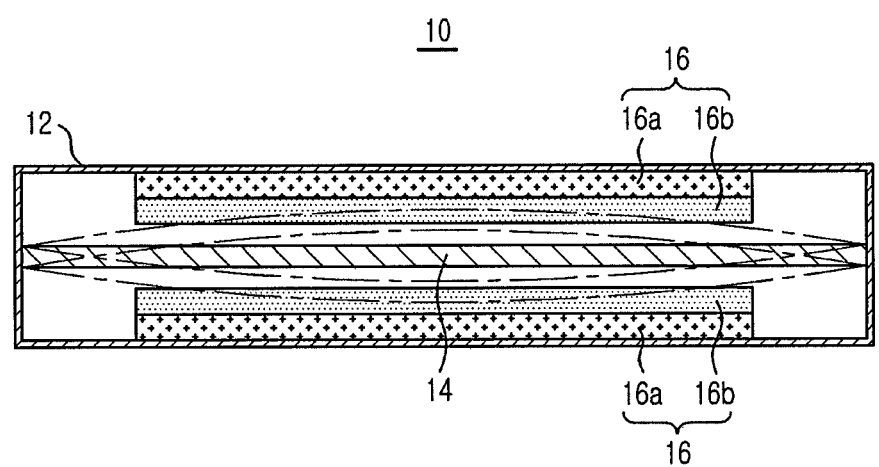
FIG. 1 is a schematic configuration diagram illustrating a vibration generating apparatus according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 is a schematic configuration diagram illustrating a vibration generating apparatus according to an embodiment of the present invention.

Meanwhile, FIG. 1, a diagram for schematically describing a technical spirit of the vibration generating apparatus according to the embodiment of the present invention, schematically shows components included in the vibration generating apparatus.

First, the technical spirit of the vibration generating apparatus according to the embodiment of the present invention will be described with reference to FIG. 1.

Referring to FIG. 1, the vibration generating apparatus 10 according to the embodiment of the present invention may include a housing 12, a vibrator 14, and a damper member 16 by way of example.

The housing 12 may have an internal space and have various shapes such as a cube shape, a rectangular parallelepiped shape, a coin shape, and the like.

In other words, the internal space of the housing 12 may have any shape.

The vibrator 14 may be disposed and vibrate within the housing 12. That is, the vibrator 14, which converts electrical energy into mechanical energy in the case in which power is supplied thereto, may vibrate in the housing 12.

Although the case in which both end portions of the vibrator 14 are fixedly attached to the housing 12 has been described by way of example in FIG. 1, the present invention is not limited thereto. That is, at least a portion (for example, one end portion) of the vibrator 14 may be fixedly attached to the housing 12, and the vibrator 14 may vibrate.

A plurality of damper members 16 may be installed in at least one of the housing 12 and the vibrator 14 and be formed of different materials. Meanwhile, the plurality of damper members 16 described above may be overlapped and formed integrally with each other.

Meanwhile, the damper members 16 may be installed on, for example, the upper internal surface and the lower internal surface of the housing 12, respectively, and contact the vibrator 14 in the case that the vibrator 14 operates normally. In other words, in the case in which the vibrator 14 vibrates normally, the damper member 16 may contact the vibrator 14.

In addition, the plurality of damper members 16 may include a first damper member 16a formed of a material having a high degree of hardness and a second damper member 16b formed of a material having a degree of hardness lower than that of the first damper member 16a.

More specifically, the first and second damper members 16a and 16b may be disposed to be overlapped with each other. That is, the first damper member 16a may be fixedly attached to the upper internal surface and the lower internal surface of the housing 12, and the second damper member 16b may be stacked on the first damper member 16a.

In addition, the second damper member 16b may serve to limit driving displacement of the vibrator 14 to improve response characteristics. That is, the second damper member 16b is disposed to contact the vibrator 14 in the case that the vibrator 14 operates normally to limit the driving displacement of the vibrator 14 as compared with the case in which the vibrator 14 and the second damper member 16b do not contact each other at the time of the normal operation of the vibrator 14, whereby response characteristics may be improved (that is, response times may be decreased).

In addition, the second damper member 16b is formed of the material having the low degree of hardness, whereby noise generated at the time of contact between the second damper member 16b and the vibrator 14 may be decreased.

Meanwhile, the first damper member 16a may absorb an impact applied by the vibrator 14 or applied to the vibrator 14 in the case the vibrator 14 operates abnormally, in other words, in the case in which an external impact is applied to the vibration generating apparatus or the vibration generating apparatus drops.

Therefore, generation of noise due to contact between the vibrator 14 and the housing 12 may be decreased, and damage due to contact may be decreased.

As described above, the first and second damper members 16a and 16b are formed of the materials having different degrees of hardness, whereby vibration characteristics may be improved and the generation of the noise and the damage may be decreased in the case in which an external impact is applied to the vibration generating apparatus.

Hereinafter, the vibration generating apparatus according to the embodiment of the present invention will be described with reference to the accompanying drawings.

Figure 2:
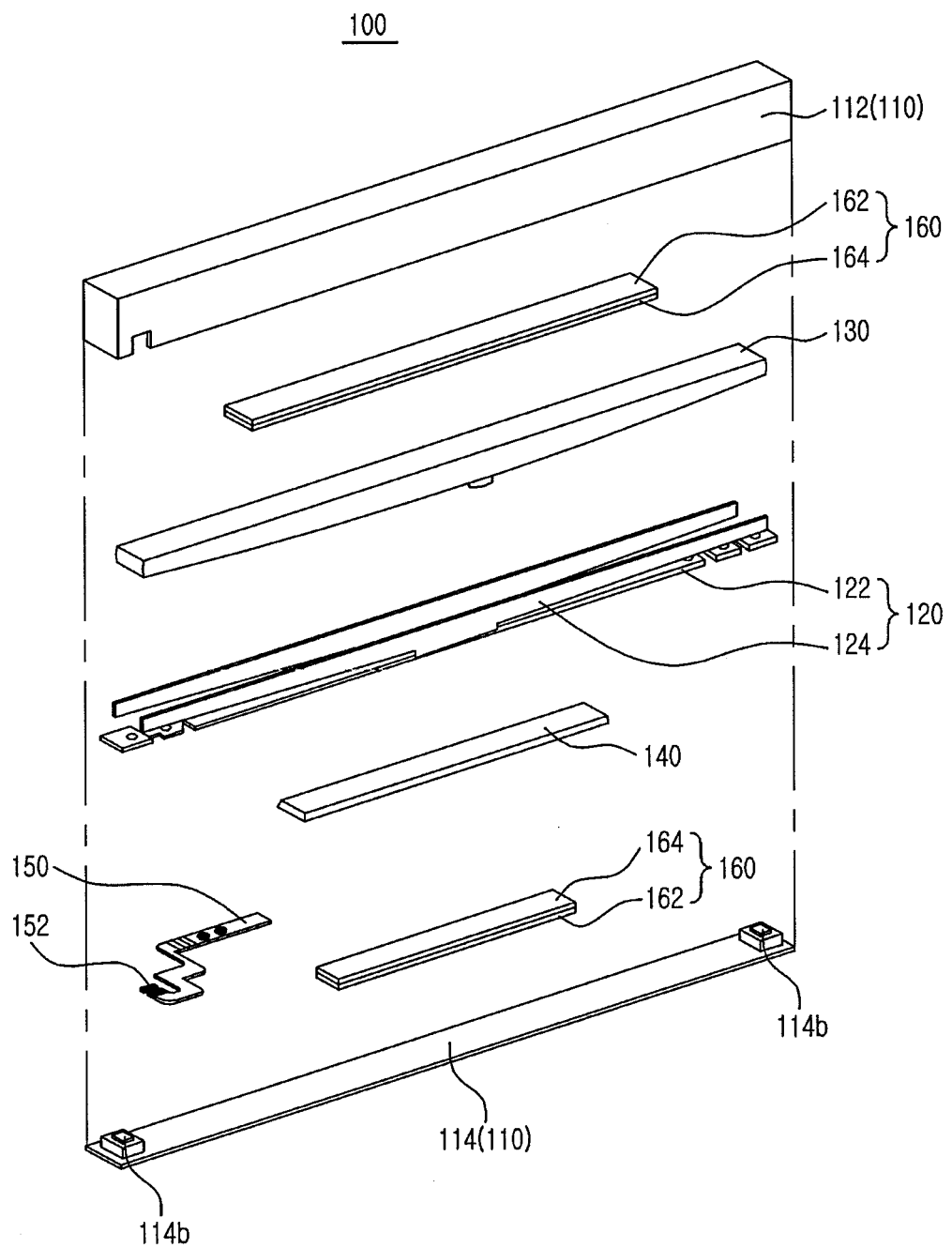
FIG. 2 is an exploded perspective view illustrating the vibration generating apparatus according to the embodiment of the present invention.

FIG. 2 is an exploded perspective view illustrating the vibration generating apparatus according to the embodiment of the present invention.

Referring to FIG. 2, the vibration generating apparatus 100 may include a housing 110, an elastic member 120, a mass body 130, a piezoelectric element 140, a circuit board 150, and a damper member 160 by way of example.

The housing 110 may have an internal space and include a seating part 114a protruding to the outside. More specifically, the housing 110 may include an upper case 112 and a bracket 114.

The upper case 112 may have a box shape in which a lower portion is opened and may have an internal space. That is, the upper case 112 may have an appearance in a box shape having a rectangular parallelepiped shape and have the bracket 114 assembled to a lower end portion thereof.

Meanwhile, one side of the upper case 112 may be provided with a withdrawal groove 112a so that the circuit board 150 may be withdrawn.

The bracket 114 may have a plate shape and includes support parts 114b formed at both end portions thereof in order to support the elastic member 120.

The elastic member 120 may have both end portions fixedly attached to the support parts 114b. That is, both end portions of the elastic member 120 may be supported by the support parts 114b of the bracket 114.

Meanwhile, the elastic member 120 may include a plate part 122 having a plate shape and extension parts 124 extended from both sides of the plate part 122.

The plate part 122 may have both end portions supported by the support parts 114b and vibrate vertically by deformation of the piezoelectric element 140 when power is supplied to the piezoelectric element 140.

Meanwhile, the extension parts 124, which are to support both sides of the mass body 140, may have a shape corresponding to that of the mass body 140.

However, the shape of the extension part 124 may be variously changed.

The mass body 130 may have both sides supported by the extension parts 124 of the elastic member 120. That is, both sides of the mass body 130 are supported by the extension parts 124, such that the mass body 130 may vibrate together with the elastic member 120 at the time of vibration of the elastic member 120.

The mass body 130 may serve to amplify vibrations of the elastic member 120 and be formed of a tungsten material.

Meanwhile, the mass body 130 may have a shape corresponding to those of the extension parts 124. Therefore, the mass body 130 may be more stably supported by the extension parts 124.

In addition, the mass body 130 and the elastic member 120 may configure the vibrator 14 (please see FIG. 1) generating vibrations by deformation of the piezoelectric element 140, and the mass body 130 and the elastic member 120 may vibrate together with each other depending on the deformation of the piezoelectric element 140.

In addition, the vibrator 14 may include the piezoelectric element 140.

The piezoelectric element 140 may have, for example, a rectangular parallelepiped shape and be fixedly attached to the elastic member 120. In other words, the piezoelectric element 140 may be fixedly attached to at least one of upper and lower surfaces of the plate part 122 of the elastic member 120 and serve to be deformed in a length direction (an X direction of FIG. 1) when power is supplied thereto, thereby allowing the elastic member 120 to vibrate.

The circuit board 150 may be disposed to be withdrawn from the inside of the housing 110 to the outside thereof and have one end connected to the piezoelectric element 140 and the other end withdrawn to the outside of the housing 110. That is, the other end of the circuit board 150 may be provided with a withdrawal part 152 withdrawn to the outside of the housing 110, wherein the withdrawal part 152 may have an external connection electrode 152a for connection to an external power supply.

A plurality of damper members 160 may be installed in at least one of the housing 110 and the vibrator 14 and be formed of different materials. Meanwhile, the plurality of damper members 160 described above may be overlapped and formed integrally with each other.

Meanwhile, the damper members 160 may be installed on the upper internal surface of the upper case 112 and an upper surface of the bracket 114, respectively, by way of example and contact the mass body 130 and the piezoelectric element 140 in the case that the elastic member 120 operates normally. In other words, in the case in which the elastic member 120 vibrates normally by the piezoelectric element 140, the damper members 160 may contact the mass body 130 and the piezoelectric element 140.

In addition, the plurality of damper members 160 may include a first damper member 162 formed of a material having a high degree of hardness and a second damper member 164 formed of a material having a degree of hardness lower than that of the first damper member 162.

More specifically, the first and second damper members 162 and 164 may be disposed to be overlapped with each other. That is, the first damper member 162 may be fixedly attached to the upper internal surface of the upper case 112 and the upper surface of the bracket 114, and the second damper member 164 may be stacked on the first damper member 162.

In addition, the second damper member 164 may serve to limit driving displacement of the vibrator 14 (please see FIG. 1) to improve response characteristics. That is, the second damper member 164 is disposed to contact the mass body 130 and the piezoelectric element 140 in the case that the elastic member 120 operates normally to limit the driving displacement of the elastic member 120 as compared with the case in which the vibrator 14, that is, the mass body 130 and the piezoelectric element 140 do not contact the second damper member 164 at the time of the normal operation of the elastic member 120, whereby response characteristics may be improved (that is, response times may be decreased).

In addition, the second damper member 164 is formed of the material having the low degree of hardness, whereby noise generated at the time of contact between the second damper member 164 and the vibrator 14 may be decreased.

Meanwhile, the first damper member 162 may absorb an impact applied by the mass body 130 or applied to the piezoelectric element 140 in the case that the elastic member 120 operates abnormally, in other words, in the case in which an external impact is applied to the vibration generating apparatus or the vibration generating apparatus drops.

Therefore, generation of noise due to contact between the mass body 130 and the housing 110 may be decreased, and damage of the piezoelectric element 140 due to an impact may be decreased.

As described above, the first and second damper members 162 and 164 are formed of the materials having different degrees of hardness, whereby vibration characteristics may be improved and the generation of the noise and the damage may be decreased in the case in which an impact is applied to the vibration generating apparatus from the outside.

Hereinafter, an operation of the vibration generating apparatus according to the embodiment of the present invention will be described with reference to the accompanying drawings.

Figure 3:
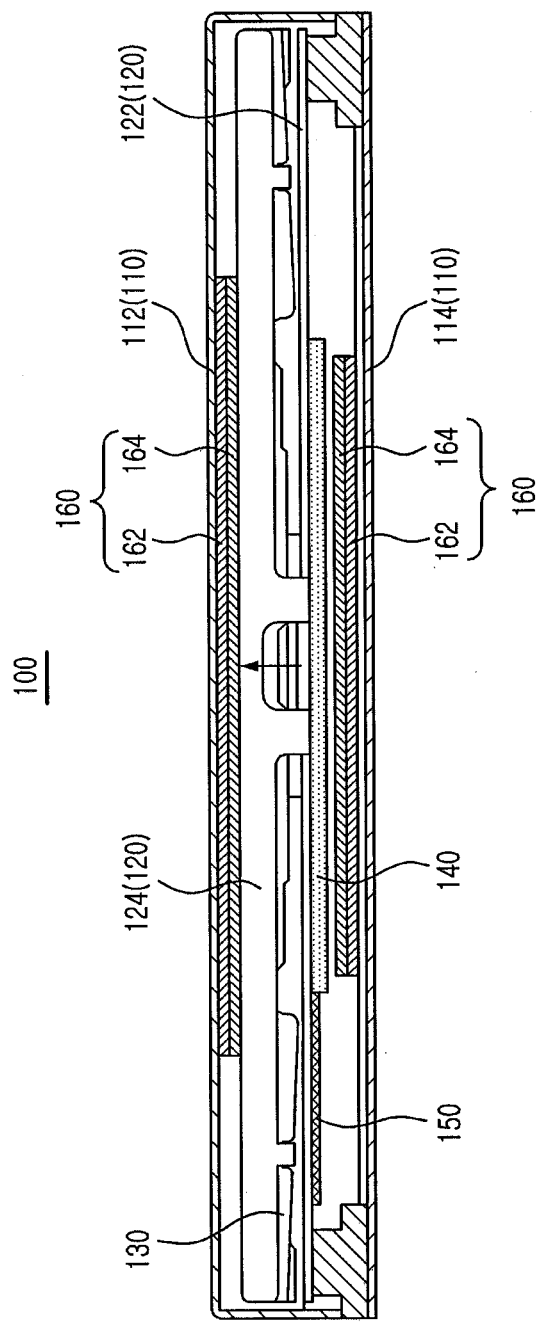
FIGS. 3 and 4 are diagrams for describing an operation of the vibration generating apparatus shown in FIG. 2.
Figure 4:
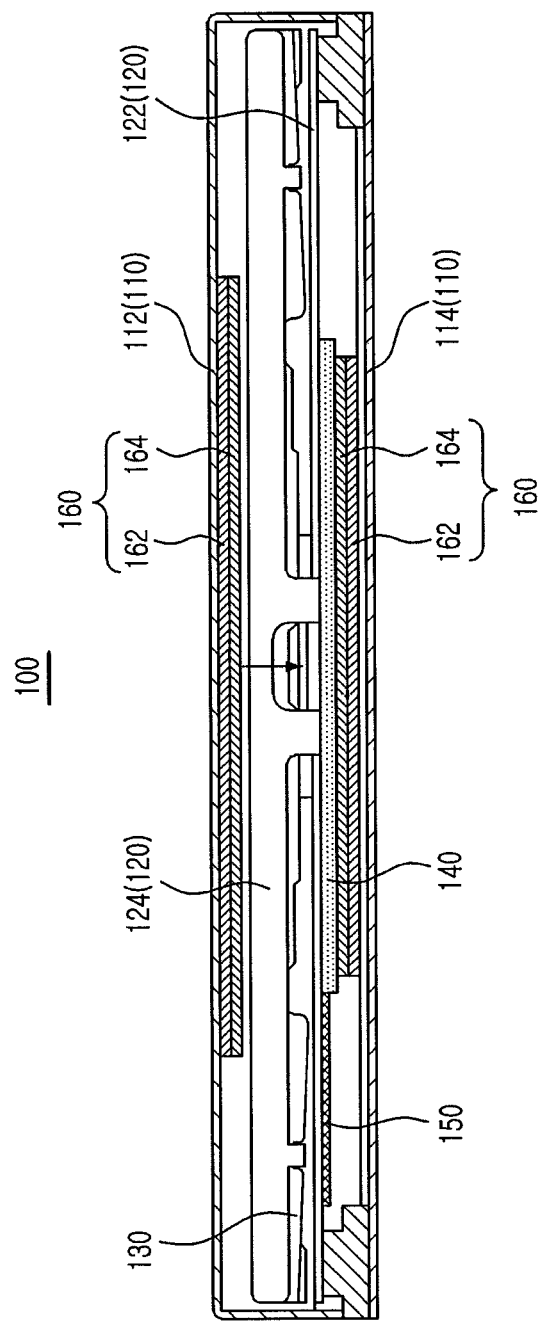

FIGS. 3 and 4 are diagrams for describing an operation of the vibration generating apparatus shown in FIG. 2.

That is, FIGS. 3 and 4 are diagrams for describing the case in which the vibration generating apparatus operates normally.

As shown in FIGS. 3 and 4, when power is applied to the piezoelectric element 140 of the vibration generation apparatus 100, the elastic member 120 and the mass body 130 may vibrate in the housing 110 by deformation of the elastic member 120.

In this case, as shown in FIG. 3, in the case in which the elastic member 120 is deformed upwardly, the mass body 130 may contact the second damper member 164 of the damper member 160 installed on the upper internal surface of the housing 110.

Then, as shown in FIG. 4, in the case in which the elastic member 120 is deformed downwardly, the piezoelectric element 140 may contact the second damper member 164 of the damper member 160 installed on the lower internal surface of the housing 110.

In addition, as shown in FIGS. 3 and 4, when the vibration generating apparatus operates normally, only the second damper member 164 rather than the first damper member 162 may be elastically deformed by contact between the mass body 130 and the piezoelectric element 140.

However, in the case in which an impact is applied from the outside to the vibration generating apparatus, in other words, in the case in which the elastic member 120 is abnormally operated, the mass body 130 and the piezoelectric element 140 presses the second damper member 164 until the first damper member 162 is deformed, such that the second damper member 164 absorbs an impact.

Therefore, even in the case in which an impact is applied from the outside to the vibration generating apparatus, damage to the housing 110 and the piezoelectric element 140 may be prevented, and generation of noise due to contact between the housing 110 and the mass body 130 may be prevented.

Further, displacement of the elastic member 120 is limited by the second damper member 164 to increase a response speed, whereby response characteristics may be improved.

Figure 5:
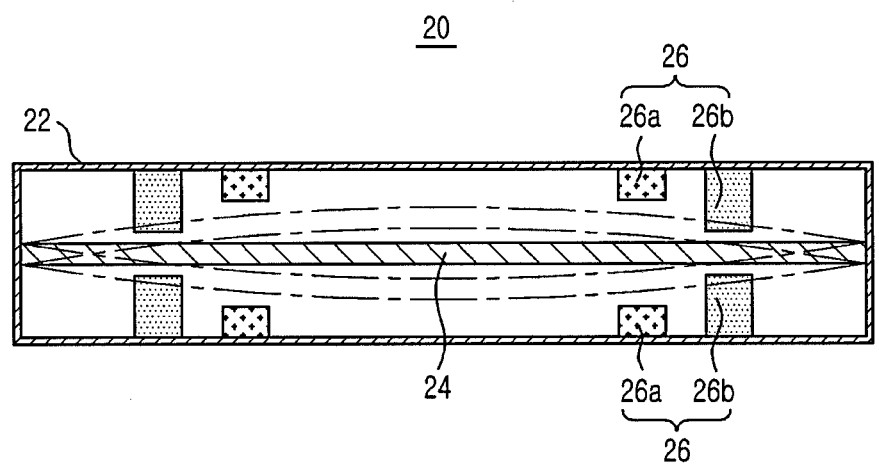
FIG. 5 is a schematic configuration diagram illustrating a vibration generating apparatus according to another embodiment of the present invention.

FIG. 5 is a schematic configuration diagram illustrating a vibration generating apparatus according to another embodiment of the present invention.

Meanwhile, FIG. 5, a diagram for schematically describing a technical spirit of the vibration generating apparatus according to another embodiment of the present invention, schematically shows components included in the vibration generating apparatus.

First, the technical spirit of the vibration generating apparatus according to another embodiment of the present invention will be described with reference to FIG. 5.

Referring to FIG. 5, the vibration generating apparatus 20 according to another embodiment of the present invention may include a housing 22, a vibrator 24, and a damper member 26 by way of example.

The housing 22 may have an internal space and have various shapes such as a cube shape, a rectangular parallelepiped shape, a coin shape, and the like.

In other words, the housing 22 may have any shape with the internal space.

The vibrator 24 may be disposed and vibrate within the housing 22. That is, the vibrator 24, which converts electrical energy into mechanical energy in the case in which power is supplied thereto, may vibrate in the housing 22.

Although the case in which both end portions of the vibrator 24 are fixedly attached to the housing 22 has been described by way of example in FIG. 1, the present invention is not limited thereto. That is, at least a portion (for example, one end portion) of the vibrator 24 may be fixedly attached to the housing 22, and the vibrator 24 may vibrate.

A plurality of damper members 26 may be installed in at least one of the housing 22 and the vibrator 24 and be formed of different materials. Meanwhile, the plurality of damper members 26 described above may be disposed to be spaced apart from each other by a predetermined interval and have different thicknesses.

Meanwhile, the damper members 26 may be installed on, for example, the upper internal surface and the lower internal surface of the housing 22, respectively, and contact the vibrator 24 in the case that the vibrator 24 operates normally. In other words, in the case in which the vibrator 24 vibrates normally, the damper member 26 may contact the vibrator 24.

In addition, the plurality of damper members 26 may include a first damper member 26a formed of a material having a high degree of hardness and a second damper member 26b formed of a material having a degree of hardness lower than that of the first damper member 26a.

More specifically, the first and second damper members 26a and 26b may be disposed to be spaced apart from each other by a predetermined interval and have different thicknesses.

In addition, the second damper member 26b may serve to limit driving displacement of the vibrator 24 to improve response characteristics. That is, the second damper member 26b may have a thickness thicker than that of the first damper member 26a so that it contacts the vibrator 24 in the case that the vibrator 24 operates normally. Therefore, driving displacement of the vibrator 24 is limited as compared with the case in which the vibrator 24 and the second damper member 26b do not contact each other in the case that the vibrator 24 operates normally, whereby response characteristics may be improved (that is, response times may be decreased).

In addition, the second damper member 26b is formed of the material having the low degree of hardness, whereby noise generated at the time of contact between the second damper member 26b and the vibrator 24 may be decreased.

Meanwhile, the first damper member 26a may absorb an impact applied by the vibrator 24 or applied to the vibrator 24 in the case the vibrator 24 operates abnormally, in other words, in the case in which an external impact is applied to the vibration generating apparatus or the vibration generating apparatus drops.

Therefore, generation of noise due to contact between the vibrator 24 and the housing 22 may be decreased, and damage due to contact may be decreased.

As described above, the first and second damper members 26a and 26b are formed of the materials having different degrees of hardness, whereby vibration characteristics may be improved and the generation of the noise and the damage may be decreased in the case in which an impact is applied from the outside to the vibration generating apparatus.

Hereinafter, the vibration generating apparatus according to another embodiment of the present invention will be described with reference to the accompanying drawings. However, the same components as the components described in the specific application example of the vibration generating apparatus according to the embodiment of the present invention described above will be denoted by the same reference numerals, and a detailed description thereof will be replaced by the above-mentioned description and be omitted.

Figure 6:
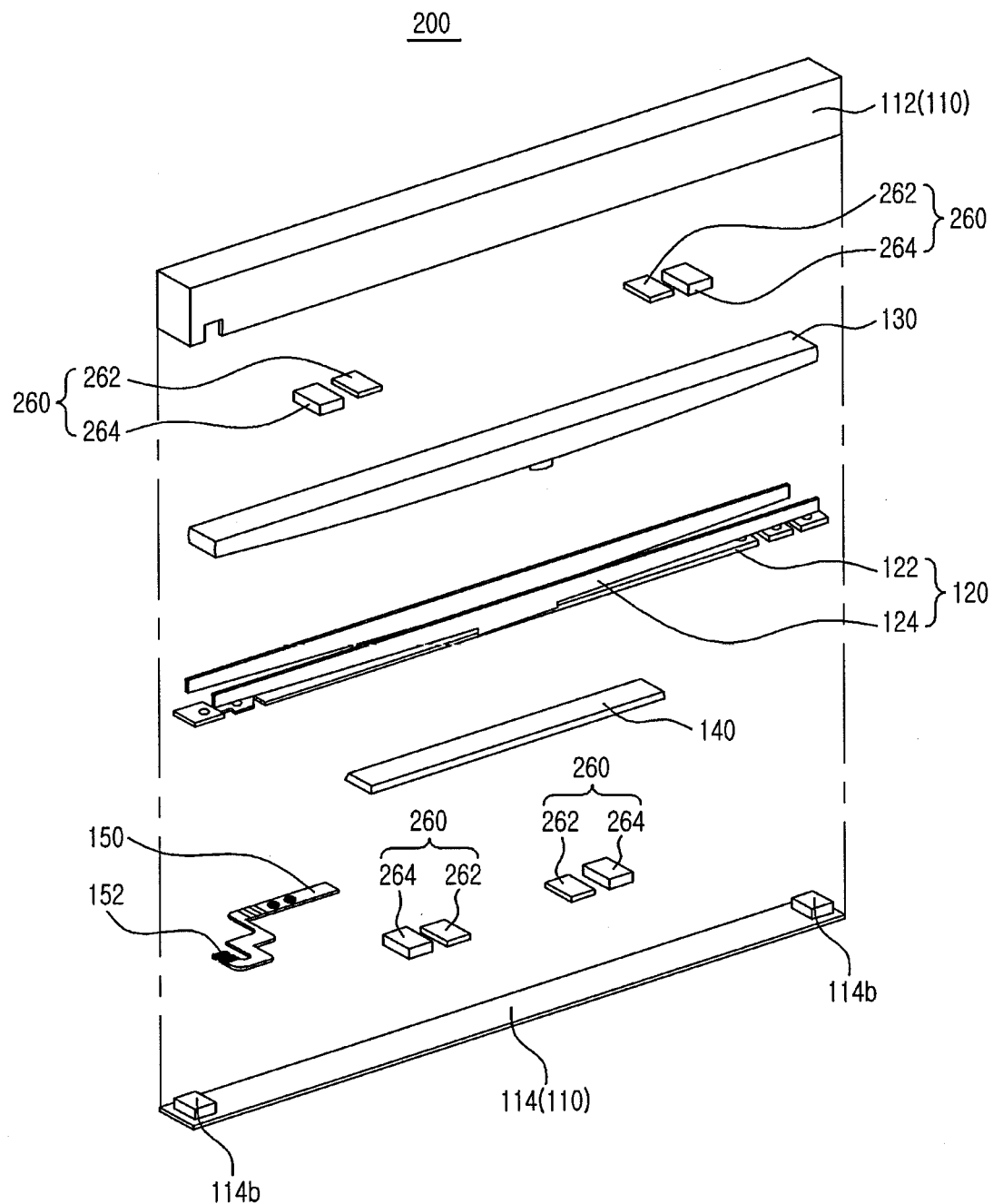
FIG. 6 is an exploded perspective view illustrating the vibration generating apparatus according to another embodiment of the present invention.
Figure 7:
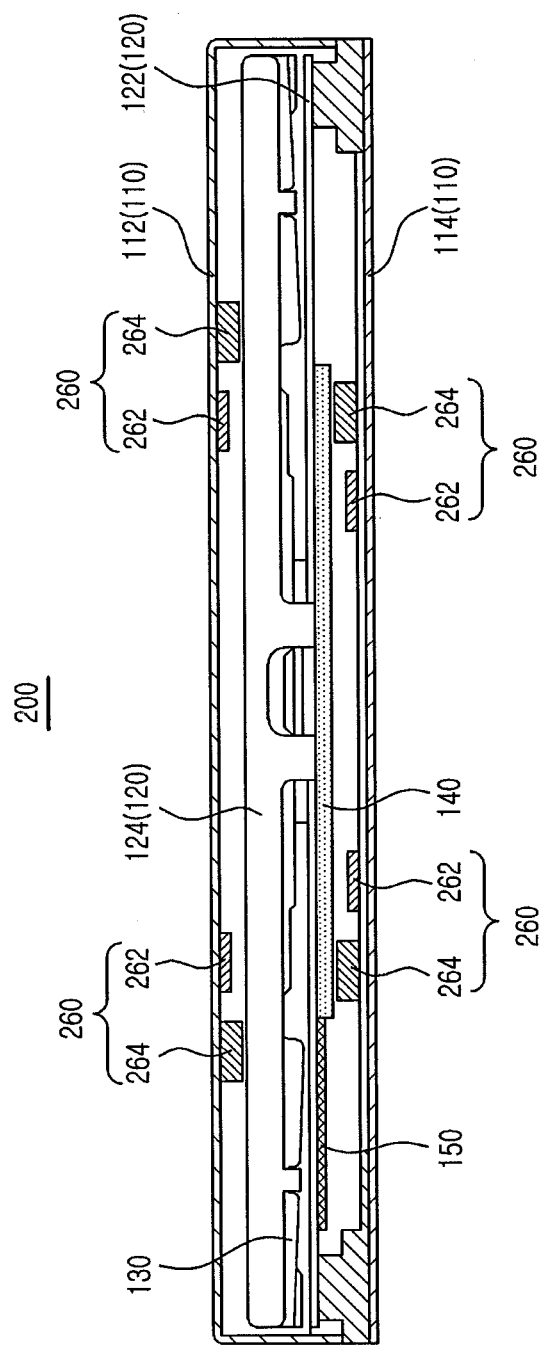
FIG. 7 is a cross-sectional view illustrating the vibration generating apparatus according to another embodiment of the present invention.

FIG. 6 is an exploded perspective view illustrating the vibration generating apparatus according to another embodiment of the present invention; and FIG. 7 is a cross-sectional view illustrating the vibration generating apparatus according to another embodiment of the present invention.

Referring to FIGS. 6 and 7, the vibration generating apparatus 200 may include a housing 110, an elastic member 120, a mass body 130, a piezoelectric element 140, a circuit board 150, and a damper member 260 by way of example.

Meanwhile, since the housing 110, the elastic member 120, the mass body 130, the piezoelectric element 140, and the circuit board 150 are the same as the components described above, a detailed description thereof will be omitted.

A plurality of damper members 260 may be installed in at least one of the housing 110 and at least one of vibrators (that is, the mass body 130 and the piezoelectric element 140) and be formed of different materials. Meanwhile, the plurality of damper members 260 described above may be disposed to be spaced apart from each other by a predetermined interval and have different thicknesses.

Meanwhile, the damper members 260 may be installed on the upper internal surface of the upper case 112 and an upper surface of the bracket 114, respectively, by way of example and contact the mass body 130 and the piezoelectric element 140 in the case that the elastic member 120 operates normally. In other words, in the case in which the elastic member 120 vibrates normally by the piezoelectric element 140, the damper members 260 may contact the mass body 130 and the piezoelectric element 140.

In addition, the plurality of damper members 260 may include a first damper member 262 formed of a material having a high degree of hardness and a second damper member 264 formed of a material having a degree of hardness lower than that of the first damper member 262.

More specifically, the first and second damper members 262 and 264 may be disposed to be spaced apart from each other by a predetermined interval and have different thicknesses. As an example, the first damper member 262 may be fixedly attached to the upper internal surface of the upper case 112 and the upper surface of the bracket 114, and the second damper member 264 may be installed at an inner side or an outer side of the first damper member 262. In addition, the second damper member 264 may have a thickness thicker that that of the first damper member 262.

In addition, the second damper member 264 may serve to limit driving displacement of the vibrator 14 (please see FIG. 1) to improve response characteristics. That is, the second damper member 264 is disposed to contact the mass body 130 and the piezoelectric element 140 in the case that the elastic member 120 operates normally to limit the driving displacement of the elastic member 120 as compared with the case in which the vibrator 14, that is, the mass body 130 and the piezoelectric element 140 do not contact the second damper member 264 at the time of the normal operation of the elastic member 120, whereby response characteristics may be improved (that is, response times may be decreased).

In addition, the second damper member 264 is formed of the material having the low degree of hardness, whereby noise generated at the time of contact between the second damper member 264 and the vibrator 14 may be decreased.

Meanwhile, the first damper member 262 may absorb an impact applied by the mass body 130 or applied to the piezoelectric element 140 in the case that the elastic member 120 operates abnormally, in other words, in the case in which an external impact is applied to the vibration generating apparatus or the vibration generating apparatus drops.

That is, since the first damper member 262 formed of the material having the high degree of hardness may prevent the mass body 130 and the piezoelectric element 140 from contacting the housing 110, generation of noise due to contact between the mass body 130 and the housing 110 may be decreased, and damage to the piezoelectric element 140 due to an impact may be decreased.

As described above, the first and second damper members 262 and 264 are formed of the materials having different degrees of hardness, whereby vibration characteristics may be improved and the generation of the noise and the damage may be decreased in the case in which an impact is applied from the outside to the vibration generating apparatus.

Meanwhile, while the vibration generating apparatuses including the piezoelectric element and having the rectangular parallelepiped shape have been described using examples of the vibration generating apparatuses according to the embodiment of the present invention and another embodiment of the present invention, the present invention is not limited thereto. That is, the technical spirit of the vibration generating apparatuses according to the embodiment of the present invention and another embodiment of the present invention may be applied to various vibration generating apparatuses capable of generating vibrations.

As set forth above, according to the embodiments of the present invention, an amount of vibrations may be increased and generation of noise and damage may be decreased by the plurality of damper members formed of different materials.

While the present invention has been shown and described in connection with the embodiments, it will be apparent to those skilled in the art that modifications and variations can be made without departing from the spirit and scope of the invention as defined by the appended claims.

What is claimed is:

1. A vibration generating apparatus comprising:
a housing having an internal space;
a vibrator disposed and vibrating within the housing; and
a plurality of damper members being disposed at least one space of the internal space, and each of the damper members being formed of different materials, and one of the damper members being contact with the vibrator, wherein
the plurality of damper members are disposed either by overlapping of each of the damper members one another or integrally disposed each of the damper members adjacent to each other.

2. The vibration generating apparatus of claim 1, wherein the plurality of damper members includes a first damper member formed of a material having a high degree of hardness and a second damper member formed of a material having a degree of hardness lower than that of the first damper member.

3. The vibration generating apparatus of claim 2, wherein the second damper member contacts the vibrator in the case that the vibrator operates normally, and the first damper member absorbs an impact in the case the vibrator operates abnormally.

4. The vibration generating apparatus of claim 3, wherein the second damper member is disposed to face the vibrator, and the first damper member is disposed to face the vibrator, having the second damper member disposed therebetween.

5. The vibration generating apparatus of claim 3, wherein the second damper member has a thickness less than that of the first damper member to contact the vibrator at the time of the abnormal operation of the vibrator.

6. A vibration generating apparatus comprising:
a housing having an internal space;
an elastic member having both end portions thereof fixedly attached to the housing;
a piezoelectric element installed on the elastic member and deformed in the case in which power is applied thereto;
a mass body connected to the elastic member to amplify vibrations generated by the deformation of the piezoelectric element; and
a plurality of damper members installed in at least one of the housing, the elastic member, the piezoelectric element, and the mass body and formed of different materials, wherein the plurality of damper members are overlapped and formed integrally with each other or are disposed to be adjacent to each other.

7. The vibration generating apparatus of claim 6, wherein the plurality of damper members includes a first damper member formed of a material having a high degree of hardness and a second damper member formed of a material having a degree of hardness lower than that of the first damper member.

8. The vibration generating apparatus of claim 7, wherein the second damper member contacts the mass body and the piezoelectric element in the case that the elastic member operates normally, and the first damper member absorbs an impact applied to the housing and the piezoelectric element in the case that the elastic member operates abnormally.

9. The vibration generating apparatus of claim 7, wherein the second damper member is disposed to face the mass body and the piezoelectric element, and the first damper member is disposed to face the mass body and the piezoelectric element, having the second damper member disposed therebetween.

10. The vibration generating apparatus of claim 7, wherein the second damper member has a thickness less than that of the first damper member to contact the mass body and the piezoelectric element in the case that the elastic member operates abnormally.

* * * * *